United States Patent
Stirling et al.

(10) Patent No.: US 9,751,757 B2
(45) Date of Patent: Sep. 5, 2017

(54) SINGLE MOTOR DYNAMIC CALIBRATION UNIT

(71) Applicant: Kionix, Inc., Ithaca, NY (US)

(72) Inventors: Nathan L. Stirling, King Ferry, NY (US); Luke E. DeWalt, Ithaca, NY (US); James E. Strait, Lansing, NY (US); Scott G. Adams, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 753 days.

(21) Appl. No.: 13/783,606

(22) Filed: Mar. 4, 2013

(65) Prior Publication Data

US 2014/0245810 A1 Sep. 4, 2014

(51) Int. Cl.
 *G01B 21/00* (2006.01)
 *B81C 99/00* (2010.01)
(52) U.S. Cl.
 CPC .................................. *B81C 99/005* (2013.01)
(58) Field of Classification Search
 CPC ............................... G01D 18/00; G01B 21/00
 USPC ............................................................. 73/1.79
 See application file for complete search history.

(56) References Cited

U.S. PATENT DOCUMENTS

| | | | |
|---|---|---|---|
| 6,823,279 B1 | 11/2004 | Nadkarni et al. | |
| 2005/0253806 A1* | 11/2005 | Liberty | G06F 1/3215 345/156 |
| 2009/0015277 A1* | 1/2009 | Schaule | G01R 31/2881 324/762.02 |
| 2010/0257933 A1 | 10/2010 | Verjus et al. | |
| 2012/0139175 A1 | 6/2012 | Lim | |
| 2013/0277776 A1* | 10/2013 | Herzum | H04R 19/04 257/416 |

FOREIGN PATENT DOCUMENTS

| | | |
|---|---|---|
| JP | 2012-237682 A | 12/2012 |
| WO | WO 2011/083511 A1 | 7/2011 |

OTHER PUBLICATIONS

English Translation of WO 2011/083511; Jul. 14, 2011.*
International Search Report directed to related International Patent Application No. PCT/US2013/042886, mailed Oct. 22, 2013; 2 pages.

* cited by examiner

*Primary Examiner* — Peter Macchiarolo
*Assistant Examiner* — Alexander Mercado
(74) *Attorney, Agent, or Firm* — Sterne, Kessler, Goldstein & Fox P.L.L.C.

(57) ABSTRACT

A calibration unit, system, and method for calibrating a device under test are provided. The calibration unit, system, and method use a single axis rotational unit to calibrate devices under test on a test head. The single axis rotation unit is configured to extend at an angle from a known axis. The test head can be designed in the shape of a frustum with multiple sides. The calibration unit, system, and method can use combinations of gravitational excitation, Helmholtz coil excitation, and rotational rate excitation for calibrating the device under test. The calibration unit, system, and method can calibrate a 3 degree for freedom or higher MEMS devices.

25 Claims, 9 Drawing Sheets

SINGLE MOTOR DYNAMIC CALIBRATION UNIT

BACKGROUND

Field

The embodiments are directed generally to calibrating devices under test, and specifically, to calibrating triaxis MEMS sensors by rotating the devices around a single axis.

Background Art

A triaxis MEMS sensor is a device that can sense its orientation relative to a given axis, for example the axis defined by earth's local gravitational field. More generally, a triaxis MEMS sensor can measure excitation in at least three orthogonal directions.

Within a triaxis MEMS sensor, there can be multiple sense elements capable of sensing different physical inputs. These sensors that are capable of sensing multiple physical inputs are sometimes referred to as combination sensors. For example, a triaxis MEMS sensor could simply comprise a triaxis accelerometer and, therefore, be considered a three degree-of-freedom (DOF) system—one DOF for each dimension in physical space. If a triaxis gyroscope were combined with the triaxis acceleration sensor, it would be considered a six DOF system—three DOF for the triaxis accelerometer and three DOF for the triaxis gyroscope. It is also becoming common to combine a triaxis magnetometer with a triaxis gyroscope and a triaxis accelerometer to provide a MEMS sensor having sensitivity along nine DOF. Multi-DOF combination sensors can also encompass sensing inputs that are not as easily associated with spatial directions, such as pressure and temperature. With these additions, it is possible to construct ten and eleven DOF sensors.

As triaxis MEMS sensors appear in more and more devices, for example cell phones, laptops, tablet computers, video game controls, Segways, etc., the need for triaxis MEMS sensors will continue to increase. But calibrating triaxis MEMS sensors is a time-consuming process. The calibration units can only calibrate the number of triaxis MEMS sensors that fit on the testing head. For example, if a testing head can hold 8 triaxis MEMS sensors and it takes 3 minutes to run the calibration tests and 1 minute to load and unload the triaxis MEMS sensors onto the testing head, then even if the calibration unit runs for 24 hours/day, it can only calibrate 2880 triaxis MEMS sensors in a day.

Therefore, what is needed are systems and methods to efficiently calibrate numerous triaxis MEMS sensors. In addition, there is a need to be able to calibrate multiple DOF of a device under test using the same calibration unit or similar versions of that calibration unit.

BRIEF SUMMARY

In an embodiment, a calibration unit, system, and method for calibrating a device under test are provided. The calibration unit, system, and method use a single axis rotational unit to calibrate devices under test on a position using excitation along at least three degrees of freedom. The single axis rotation unit is configured to extend at an angle from a known axis.

In an embodiment, the calibration unit includes a test head that is designed in the shape of a four-sided frustum.

In another embodiment, a calibration unit, system, and method use gravitational excitation, Helmholtz coil excitation, rotational rate excitation, and rotational acceleration excitation for calibrating the device under test.

In another embodiment, a calibration unit, system, and method for calibrating triaxis MEMS devices are provided.

Further features and advantages of the embodiments, as well as the structure and operation of various embodiments, are described in detail below with reference to the accompanying drawings. It is noted that the embodiment is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

Figure 1:
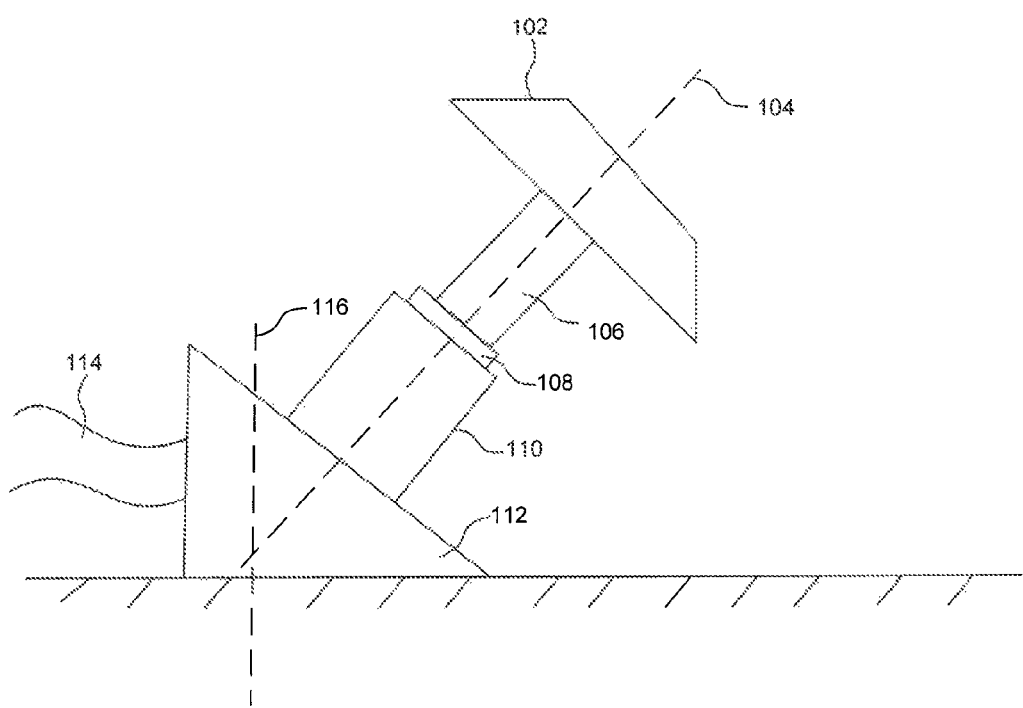
FIG. 1 illustrates a calibration device, according to an embodiment.

The features and advantages of the embodiments will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE EMBODIMENTS

Example Calibration Unit

An embodiment of the present invention is directed to a calibration unit for calibrating one or more MEMS sensors. This calibration unit may be included in a calibration system, as illustrated in FIG. 7.

Typically, a calibration system contains two test subsystems, a handler and a tester. As shown in FIG. 7, a handler 700 moves devices under test ("DUTS") from a supply such as a bowl feeder 706, through various stages of testing, for example at dynamic calibration units 702 and static test units 704, and finally brings the parts to either a failure binning area 708 or to an output for passing DUTS such as a tape and reel output 710.

Figure 7:
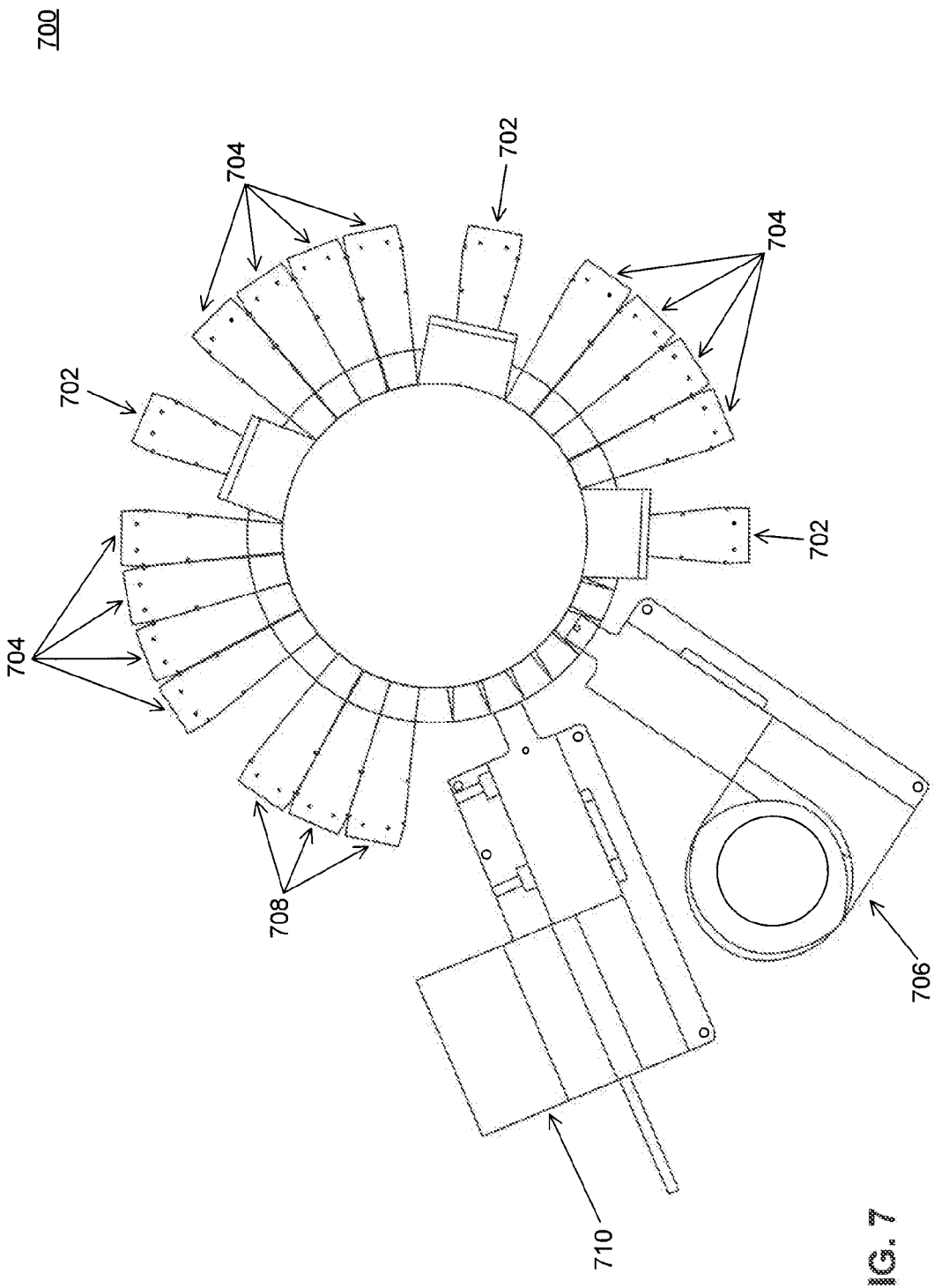
FIG. 7 illustrates a turret tester, according to an embodiment.

In the embodiment shown in FIG. 7, handler 700 is a turret system that picks up parts from a bowl feeder 706 and indexes parts to the various stations around its perimeter.

Each part does not necessarily go through all of the tester substations. For example, three parts may be picked up by three heads on the turret tester. The turret could rotate around and place one part in each of the dynamic calibration units 702. After testing is complete in this tester substation, the parts could each be picked up and indexed to the next available static test stations 704 for further programming or testing.

FIG. 1 is an illustration of a single axis of rotation calibration unit 100, according to an embodiment. Calibration unit 100 comprises a rotatable testing surface 102 mounted to a first end of a shaft 106. Shaft 106 rotates about a spin axis 104. In an embodiment, spin axis 104 is designed to be 45 degrees from reference axis 116, which may be, for example, the axis defined by the earth's local gravitational field. In an embodiment, a second end of the shaft 106 is mounted to a rotation disk 108. Rotation disk 108 can be mounted to a motor 110. Motor 110 is configured to rotate rotation disk 108, and through rotation disk 108, rotate shaft 106 and rotatable testing surface 102.

In an embodiment, motor 110 is mounted on a base unit 112. Base unit 112 is connected to ribbon 114, which electrically couples base unit 112 to a computer (such as computer system 400 of FIG. 4). The computer is configured to control the motor 110 to adjust the angular position, velocity, and acceleration of rotation disk 108. The computer is also configured to read output information from any devices under test (DUTs) mounted to the rotatable testing surface (described below) and calibrate the DUTs accordingly. Ribbon 114 is typically connected electrically to the DUT via either cabling or slip rings. Cabling is typical in more traditional dual axis servo tipping stations where the actuation does not occur over more than one complete revolution. One advantage of the proposed testing unit is that it can be configured with slip rings which permit an unlimited number of revolutions. Slip rings are possible in this system because the rotatable testing surface 102 rotates only about a single axis.

Calibration unit 100 is configured to calibrate triaxis MEMS sensors. More specifically, calibration unit 100 can be configured to adjust a position, velocity, acceleration, angular velocity, or angular acceleration of a triaxis MEMS sensor in order to vary the excitations needed for calibration. Calibration of a triaxis MEMS sensor is described below with reference to FIGS. 5 and 6.

Figure 6:
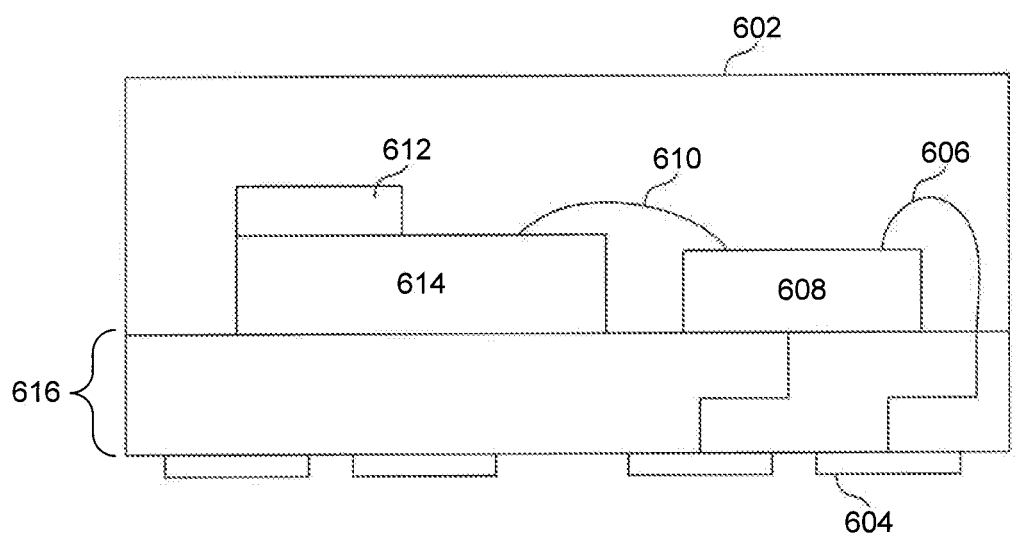
FIG. 6 illustrates a triaxis sensor, according to an embodiment.

FIG. 6 shows a triaxis MEMS sensor 602. Triaxis MEMS sensor 602 has I/O pads 604 used to read output of a sensor and calibrate the sensor accordingly. Application Specific Integrated Circuit (ASIC) 608 is connected to sensing element 614 via wire bond 610. Lid 612 protects sensing element 614 during packaging steps such as when an overmold compound is added to complete the device. ASIC 608 and sensing element 614 sit on a layer of laminate 616. ASIC 608 can also be connected to the laminate via wire 606.

Figure 5:
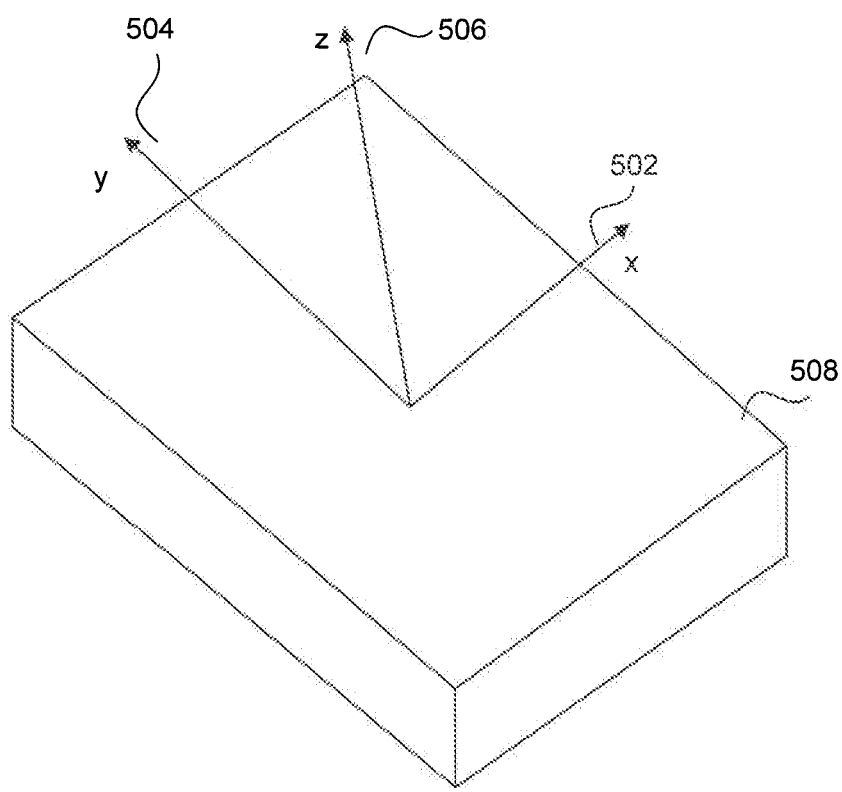
FIG. 5 is a diagram of rotation, excitation, and sensing axes, according to an embodiment.

FIG. 5 shows a triaxis MEMS sensor 508 that has three sense axes 502, 504, and 506 defined by the sensing element 614 and aligned with the orientation of the MEMS packaging. As excitation is applied to the three axes, each one responds based on a basic equation: Output=Sensitivity*Excitation+Offset. As manufactured, the sensitivity and offset of a MEMS sensor is not known precisely due to expected fluctuations in the manufacturing process. In the as-manufactured state, the sensor is considered uncalibrated. In the equation above, there are two unknowns with an uncalibrated device, the sensitivity and the offset. Calibrating the sensor involves solving for these unknowns and adjusting the electronics such that each part produces the same output for the same input excitation.

There are many ways to calibrate each axis of a sensor. In general, at least two known excitation inputs need to be applied to the sensor, and two outputs need to be measured to calibrate both the offset and sensitivity.

The excitation inputs vary depending on the type of physical principle being measured. For example, gravity can serve as the excitation used to calibrate an accelerometer with the upward direction being considered the excitation axis. For a gyroscope, the excitation axis would be an axis about which a sensor is spun. For a magnetometer, the excitation axis could be defined by the earth's local gravitational direction, the field generated with a Helmholtz coil, or an appropriately positioned permanent magnet. Slightly more abstractly, the excitation axis for a pressure sensor could be considered the ambient pressure. For a temperature sensor, the excitation axis could be the ambient temperature around the sensor.

Calibration unit 100 is configured to perform a set of tests on sensors and calibrate them based on their responses to the tests. In each test, the excitations are varied and the responses measured. Typically, in the case of a MEMS sensor, coefficients are programmed into ASICs such as 608 such that the sensitivities and offsets of the sensors are calibrated to a uniform value. After a group of triaxis MEMS sensors have been manufactured, they can be loaded onto rotatable testing head 102 within calibration unit 100. In the embodiment illustrated in FIG. 1, up to four triaxis MEMS sensors can be loaded onto rotatable testing head 102.

Rotatable testing head 102 verifies that each DUT is connected electrically to the testing head and then performs a series of tests on the DUT. For example, to test a triaxis MEMS sensor rotatable testing head 102 may tilt the DUTs along three orthogonal axes, read the outputs from the DUTs, and calibrate the DUTs to provide a correct output. Rotatable testing head 102 may also spin the DUTs at different speeds in order to calibrate any gyroscopes within the DUTs.

Once rotatable testing head 102 has performed all the necessary tests on the DUTs and calibrated the DUTs accordingly, the group of DUTs is removed. At this point, the process of calibrating DUTs can be started again with a new set of DUTs.

Figure 2A:
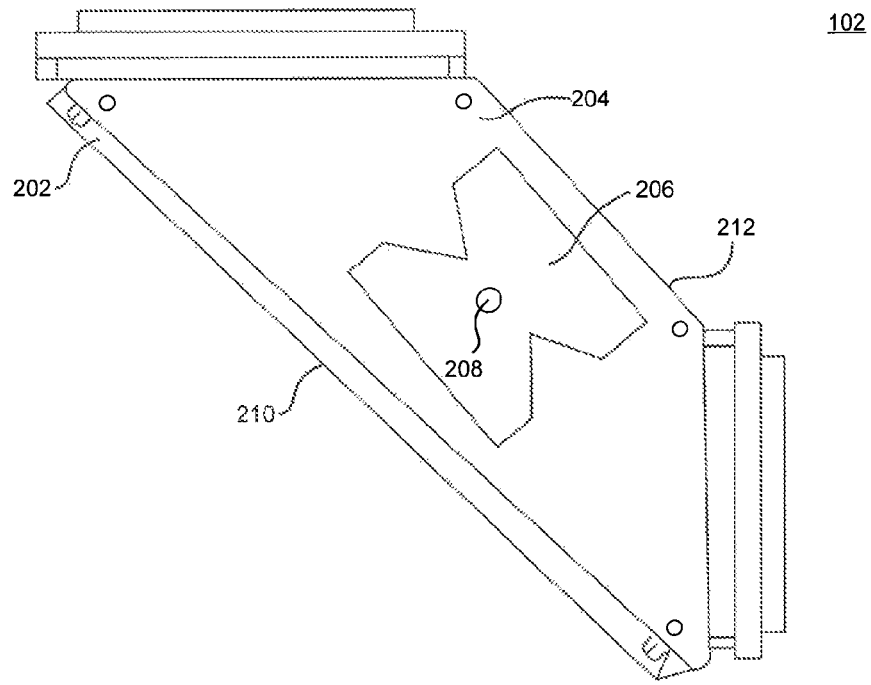
FIG. 2A illustrates a side view of a rotatable testing surface, according to an embodiment.
Figure 2B:
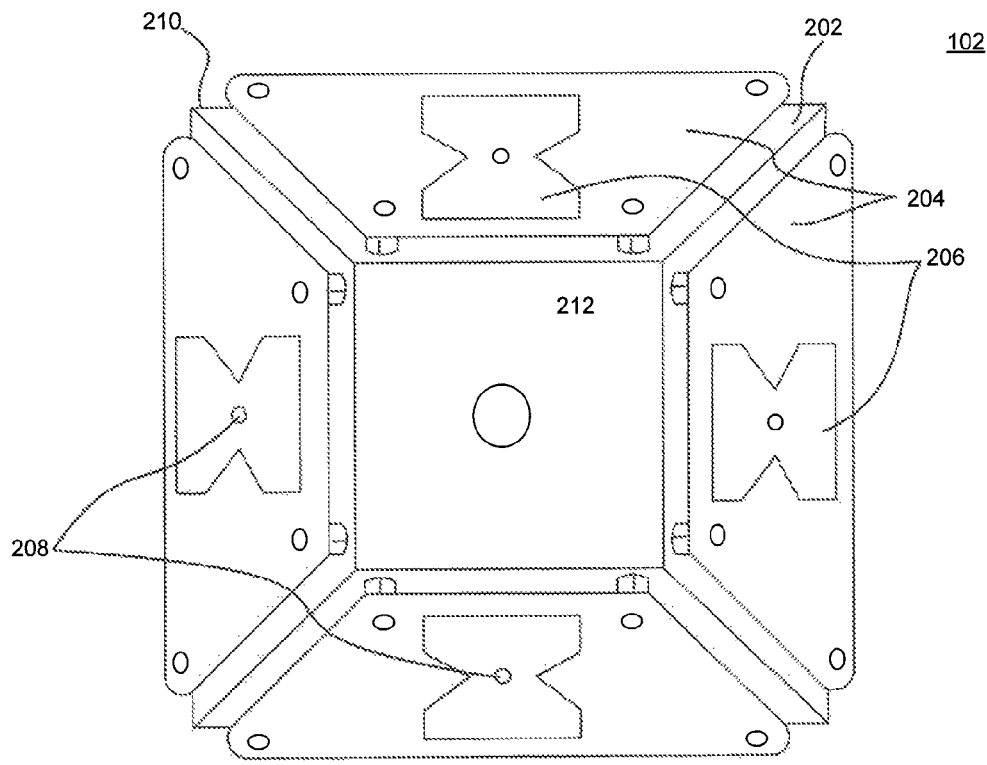
FIG. 2B illustrates a top view of a rotatable testing surface, according to an embodiment.

FIGS. 2A and 2B illustrate embodiments of rotatable testing surface 102. FIG. 2A illustrates a side view of rotatable testing surface 102. FIG. 2B shows rotatable testing surface 102 from a top view along spin axis 104.

In an embodiment, rotatable testing surface 102 is designed as a four-sided frustum with a base 210 and a top 212. The base 210 and top 212 are designed to be parallel squares with base 210 being larger than top 212. The four sides 202 are designed such that at each corner of base 210 or top 212 two of the sides make a 90 degree angle, and that the portion of each side 202 from base 210 to top 212 makes a 45 degree angle with base 210 and a 135 degree angle with top 212.

In an embodiment, a testing plate 204 is mounted to each side 202 of rotatable testing surface 102 as shown in FIG. 2. Rotatable testing head 102 is configured to hold a DUT in place during the calibration process. In an embodiment, the DUT is placed in position 208, and held in place by clamping unit 206. Position 208 may also include electrical connections that allow a remote computer (not shown) to read the output of the DUT and make the appropriate calibrations. A skilled designer would understand that this is only an exemplary illustration of how a DUT may be placed, and that DUTs may be placed in other positions, and that more than one DUT may be placed on each testing head 204.

In an embodiment, calibration unit 100 is designed so that some DUTs may be tested while others are loaded and unloaded from the calibration unit. For example, referring to FIG. 2A, one or more DUTs could be unloaded or loaded from the testing head 204 on the top of testing surface 200 (testing head 204 where only the profile is currently visible in FIG. 2A). While this is happening one or more DUTs, located on the other three testing heads 204 can be undergoing different calibration testing and being calibrated accordingly.

Design of rotatable testing surface 102 is based on the various physical inputs that the triaxis MEMS sensor responds to. The specific design elements include the relative orientation of the spin, excitation, and sense axes. The excitation axis is defined by the physical principle being sensed. The sense axes such as 502, 504, and 506, are defined by the MEMS sense element. The relative orientation of the sense axes and the excitation axis are defined by the DUT position 208.

Table 1 below illustrates constraints imposed on calibration unit 100 depending on the physical input to be sensed. The measurement of acceleration is illustrative. In this example, gravity in the upward direction defines the excitation axis. The constraint on the design of the DUT position 208 is such that the spin axes cannot be parallel to any of the sense axes. If they were, rotation about the spin axis would not vary the quantity of gravity expressed on the parallel sense axis. In other words, the input excitation would not change, meaning that that particular axis could not be calibrated.

TABLE 1

| | | Constraints | |
|---|---|---|---|
| Physical Input | Number of Axes | Relation between Spin and Sense Axes | Excitation Axis |
| Acceleration | 3 | Cannot be parallel to any | Gravity in the upward direction |
| Angular velocity | 3 | Cannot be perpendicular to any | Equal to the spin axis |
| Angular acceleration | 3 | Cannot be perpendicular to any | Equal to spin axis |
| Magnetometer | 3 | Any relation | No constraint with Helmholtz coil |
| Pressure | 1 | Opening in pitot tube must be at a distance from the spin axis | Pressure |

Angular velocity (measured by gyroscopes) and angular accelerations (measured by angular accelerometers) both have excitation axes that are parallel to the spin axis. In order to express these physical inputs on the sense axes of gyroscopes and angular accelerometers, the sense axes must not be perpendicular to the spin axis. If any of the sense axes were perpendicular, the component of the angular velocity and angular acceleration that could be expressed on it would always be zero. In this case, the perpendicular axis could not be calibrated.

With magnetic fields imposed on the DUT using a three-axis Helmholtz coil, no similar constraint exists as compared to the acceleration and angular inputs. Using a Helmholtz coil, the direction and magnitude of the excitation can be varied arbitrarily by varying the currents in the various axes of the Helmholtz coil. Less sophisticated methods of applying magnetic fields are also possible such as using permanent magnets or the earth's local magnetic field.

With pressure, the only limitation is based on the method of developing the pressure. One method is to use a clamp on the DUT to hold it in position 208 that has a hole in it. This hole would form a small pitot tube. As the DUT is spun around by the calibration unit 100 about spin axis 104, air would pass by the end of the pitot tube and cause a pressure drop inside the tube that the DUT would experience. For there to be a substantial air velocity, the end of the tube near DUT position 208 should be spaced apart from the spin axis 104 by a distance. The greater the distance, the greater the air velocity and the corresponding pressure drop applied.

In an embodiment, because the spin axis 104 is 45 degrees from reference axis 116, and because the rotatable testing surface 102 is a frustum with sides that are 45 degrees from the base, and because none of the sense axes are perpendicular to the spin axis, calibration unit 100 can rotate the DUTs around a single axis (spin axis 104) and calibrate the DUTs in all three axes of acceleration, angular rate, and angular acceleration. In addition, calibration unit 100 can calibrate the DUT in all three magnetic and pressure sensing axes given the appropriate magnetic excitation and pitot tube structure, respectively. Those skilled in the art would understand that this is an example, and that angles other than 45 degrees can be used. Thus, calibration of the DUT can be performed while rotating the DUT around a single axis, rather than requiring rotation around two or more axes.

Figure 8:
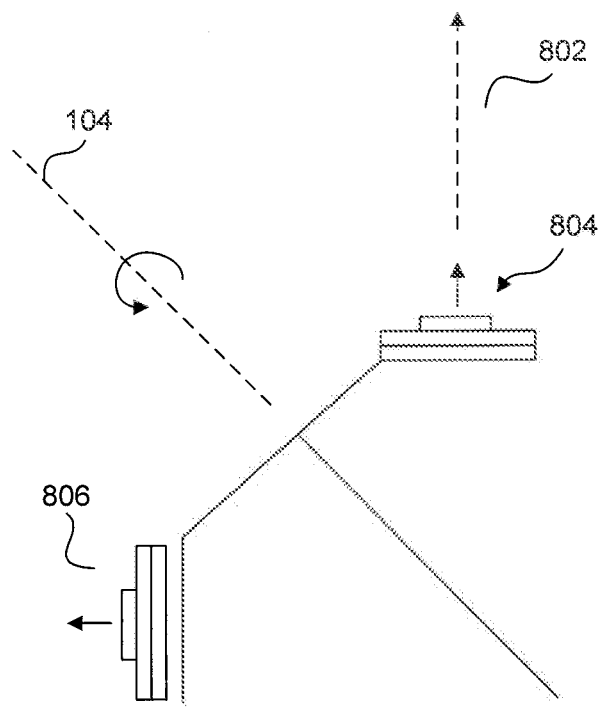
FIGS. 8 and 9 illustrate how a triaxis sensor may be rotated about an axis of rotation.
Figure 9:
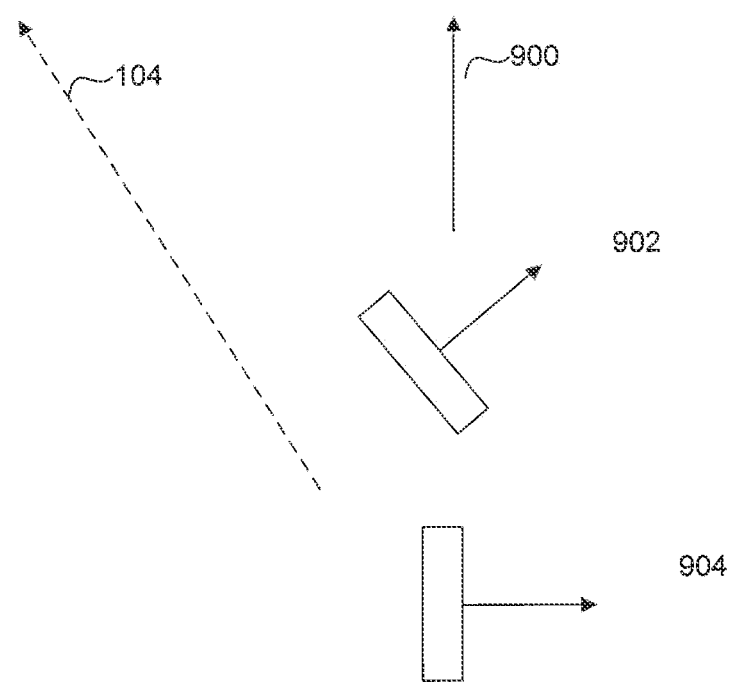

In an embodiment, none of the three sensing axes, illustrated in FIG. 5 and described above, are parallel to the spin axis 104. In another embodiment, the spin axis 104 is not in any of the three planes defined by the sensing axes. FIG. 8 shows an example of this. In FIG. 8, the DUT is at position 804 about to be rotated around spin axis 104 to position 806. The sensing axes shown in FIG. 5 can be mapped to this DUT. For example the z axis is shown as axis 802. In this embodiment, the x axis could be viewed as coming out of the figure and the y axis can be the horizontal axis. If this was the case, spin axis 104 would be in the plane defined by the z and y axes. Instead, the x and y axes could be rotated 45 degrees so that they still defined a plain perpendicular to the z axis but with each axis extending through the figure. With this orientation, spin axis 104 is not in any of the three planes defined by the x, y, or z axes. In this embodiment, if measurements are taken at position 804 and 806, six independent values will be generated that can be used to calculate the sensitivity and the offset for the x, y, and z axes.

In an embodiment, none of the three sensing axes are parallel to the force being exerted on the DUT. In another embodiment, a force being exerted on the DUT is not in any of the three planes defined by the sensing axes. For example, during calibration of an accelerometer, gravity may be used to calibrate the DUT. In such a case, the DUT would not be positioned such that its z axis is parallel to gravity. In another example the DUT would not be positioned such that the gravitation force was in any of the planes defined by the x, y, and z axes. In another example, during calibration of a gyroscopic sensor, the DUT would have to be positioned with respect to a spin axis. In an embodiment, calibration unit 100 can perform multiple types of calibration testing on the DUT's as they are rotated around spin axis 104. As described above, the DUTs relative orientation with respect to the reference axis 116 can be calibrated as the DUTs rotate around spin axis 104. In addition, other types of calibration can be performed. In an embodiment, gravitational excitation is used to calibrate the DUTs. In gravitational excitation, the DUT is moved, for example as it is rotated from one position to another, in order to simulate 1 gravitational unit (1 g). Output from the DUT are read, and it is calibrated appropriately. In an embodiment, rotational rate excitation is used to calibrate the DUT. In rotational rate excitation, the parts are calibrated while they rotate, for example from one position to another, and a known rate is calibrated accordingly. In another embodiment, Helmholtz coil testing is used to calibrate the DUT. In Helmholtz coil testing, a Helmholtz coil is used to apply a known magnetic field in the x, y, and z axes. By changing the currents applied to the Helmholtz coils, the fields can be modified in known ways. The DUT senses these magnetic fields and the changes, and the computer than use the outputs of the DUT to calibrate it accordingly. For this type of testing, a reference magnetometer can also be placed in the Helmholtz coils to verify the applied magnetic fields. These are just a few examples. Other calibration tests known a skilled designer are also possible.

In an embodiment, one or more of these tests can be run concurrently on the DUTs while they are at different positions or while they are moving between different positions. In addition, certain tests can be performed on DUTs in one position, while other tests are performed on DUTs in another position. Thus, a set of calibration tests that may require 40 second to execute can be broken down into multiple stages, and executed substantially concurrently. This allows an increase in the number of DUTs, for example triaxis MEMS sensors, that can be calibrated by a single machine in a given amount of time.

Example Method for Calibrating a Triaxis MEMS Sensor

Figure 3:
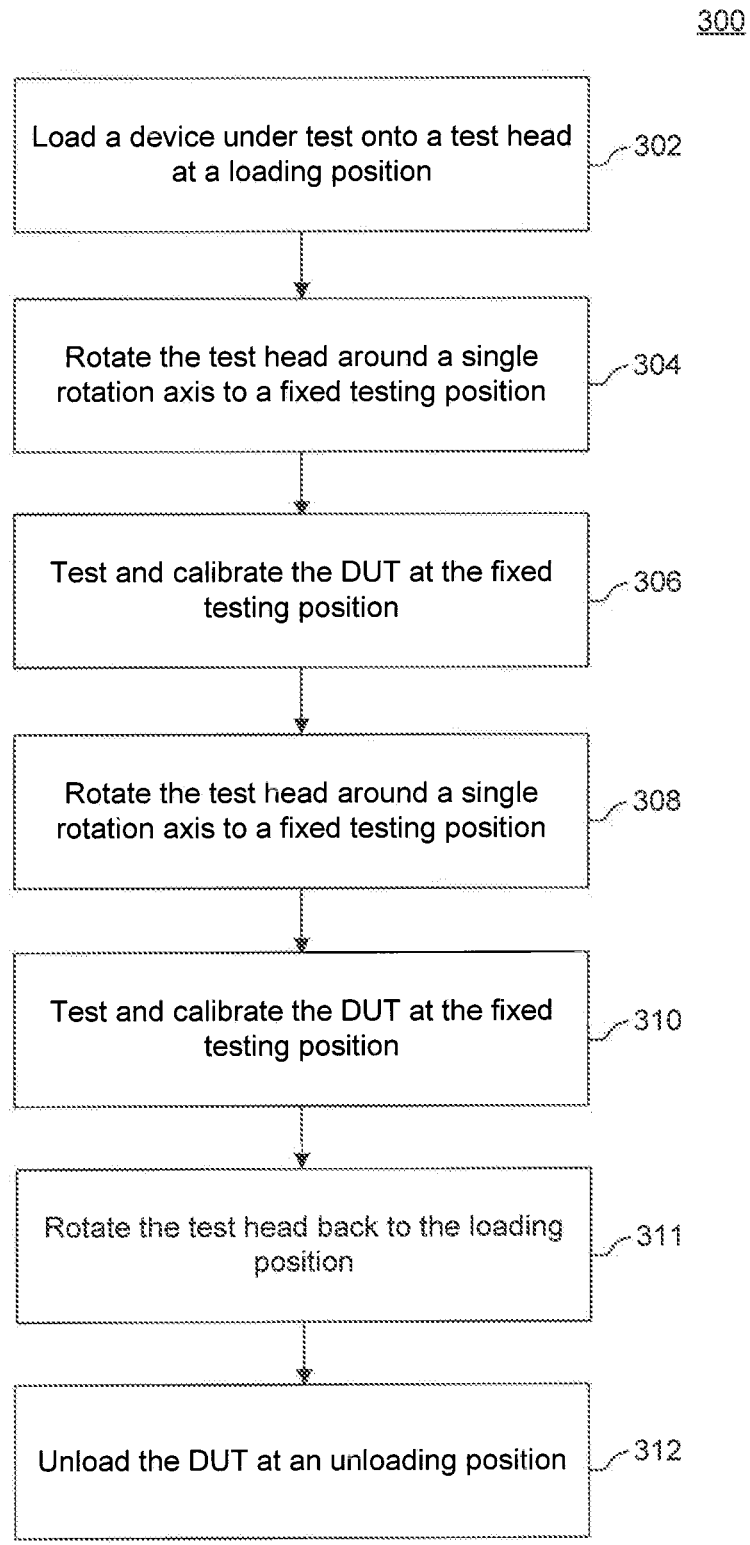
FIG. 3 is a flowchart of a method for calibrating a triaxis MEMS sensor, according to an embodiment.

FIG. 3 is a flowchart of a method 300 for calibrating a triaxis MEMS sensor, according to an embodiment.

At step 302, a device under test (DUT) is loaded onto a test head. In an embodiment, the device under test is a triaxis MEMS sensor. The DUT is loaded onto the test head at a loading position, for example the top position for testing surface 200 described above. In an embodiment, more than one DUT can be loaded onto the test head.

At step 304, the test head is rotated around a single rotation axis, for example spin axis 104 described above. The DUT is rotated to a first fixed testing position. In an embodiment, the calibration unit has four testing heads and the DUT is rotated 90 degrees around the single rotation axis. In an embodiment, calibration testing can be performed while the DUT is being rotated. This testing during rotation is considered dynamic testing. In an embodiment, the speed of the rotation can be controlled to cause the DUT to experience a predefined angular rotation rate about the rotation direction. In an embodiment, the calibration unit also performs rotational acceleration testing as the DUT is rotated from one position to the next. A person skilled in the art would understand that these tests could be done concurrently for all DUTs in the calibration unit as the DUTs rotate from one position to another. Thus, these tests may be done in different orders for different DUTs. For example, the first DUT may be loaded and rotated to a second fixed testing position. During that rotation, a first test, for example angular excitation, may be performed. Then a second DUT may be loaded and the device rotated to move the first DUT to a third fixed testing position and the second DUT to the second fixed testing position. During that rotation, a second test, for example rotational rate excitation, may be performed on both DUTs. The first DUT may then be removed and the second DUT may be rotated to the third fixed testing position. During this rotation, the first test may be performed on the second DUT. Persons skilled in the art would realize that this is just one example, and that other tests may be performed, and that other sequences are possible.

At step 306, the DUT is tested with static excitations at the first fixed testing position. In an embodiment, the testing can happen substantially concurrently with one or more DUTs being loaded onto a test head at the loading position. In an embodiment, the calibration unit can perform Helmholtz coil testing and acceleration using gravitational excitation and baseline pressure measurements of the DUT when the DUT is at different fixed testing positions. A person skilled in the art would realize that a specific test could be performed at each location. For example, all DUTs in a first fixed testing position may undergo Helmholtz coil, testing and all DUTs in a second fixed testing position may undergo gravitational excitation testing. A person skilled in the art would understand that other tests and calibrations are possible depending on the requirements of the DUT.

At step 308, the test head is rotated again around a single rotation axis, for example spin axis 104 described above. The DUT is rotated to a second fixed testing position. While the DUT is rotated, a second dynamic testing at another rate or acceleration can take place. A person skilled in the art would understand that other test combinations are possible to carry out dynamic testing and calibration.

At step 310, the DUT is tested and calibrated at the second fixed testing position. Calibration for both the static and dynamic testing is based on two or more preceding tests. Calibration takes place when coefficients are programmed into the ASIC to achieve a predefined sensitivity and offset. As described above, the testing and calibration can happen substantially concurrently with one or more DUTs being loaded onto a test head at the loading position or being tested and calibrated at the first fixed testing position.

At step 311, the DUT is rotated back to the load/unload position. While rotating to the new position, verification of the dynamic calibration can take place by testing during the rotation.

At step 312, the DUT is unloaded from the calibration tester. Prior to unloading, verification of the static calibration can take place by testing after the rotation to the load/unload position. The DUT is unloaded from the DUT at an unloading position. In an embodiment, the unloading position is the same as the loading position. In an embodiment the unloading happens substantially concurrently with the testing and calibration of other DUTs on other testing heads.

Example Computing Environment

Figure 4:
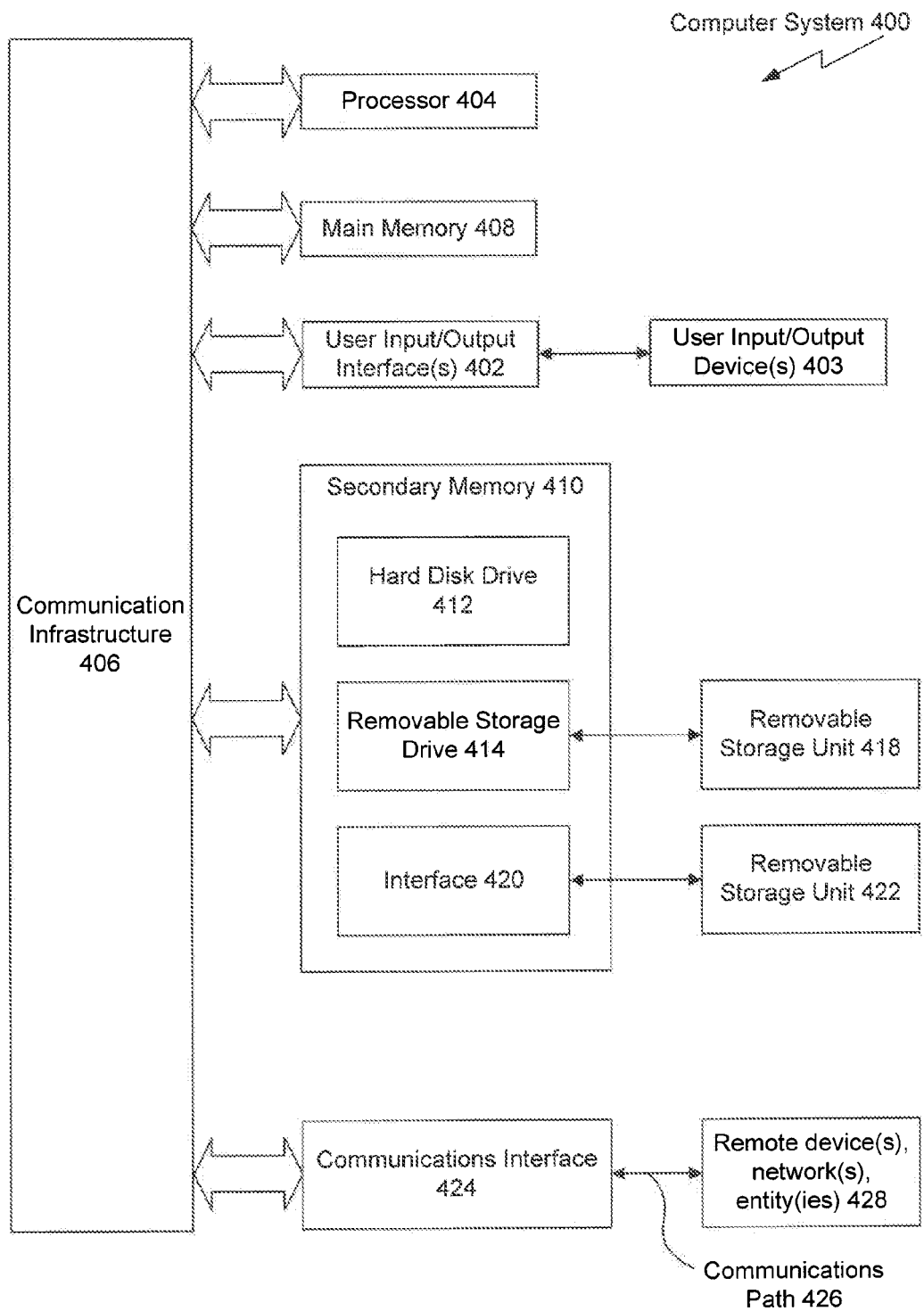
FIG. 4 is a block diagram of a computing environment where the embodiments may be implemented.

Various embodiments can be implemented, for example, using one or more well-known computer systems, such as computer system 400 shown in FIG. 4. For example, calibration unit 100 may be coupled to computer system 400 through ribbon 114, Computer system 400 can be any well-known computer capable of performing the functions described herein, such as computers available from International Business Machines, Apple, Sun, HP, Dell, Sony, and Toshiba, to name a few examples.

Computer system 400 includes one or more processors (also called central processing units, or CPUs), such as a processor 404. Processor 404 is connected to a communication infrastructure or bus 406. In an embodiment, processor 404 may be a graphics processing unit (GPU). A GPU is a processor that is a specialized electronic circuit designed to rapidly process mathematically intensive applications on electronic devices. The GPU has a highly parallel structure that is efficient for parallel processing of large blocks of data, such as mathematically intensive data common to computer graphics applications, images and videos.

Computer system 400 also includes user input/output device(s) 403, such as monitors, keyboards, pointing devices, etc., which communicate with communication infrastructure 406 through user input/output interface(s) 402.

Computer system 400 also includes a main or primary memory 408, such as random access memory (RAM). Main memory 408 may include one or more levels of cache. Main memory 408 has stored therein control logic (i.e., computer software) and/or data.

Computer system 400 may also include one or more secondary storage devices or secondary memory 410. Secondary memory 410 may include, for example, a hard disk drive 412 and/or a removable storage device or drive 414. Removable storage drive 414 may be a floppy disk drive, a magnetic tape drive, a compact disk drive, an optical storage device, tape backup device, and/or any other storage device/drive.

Removable storage drive 414 may interact with a removable storage unit 418. Removable storage unit 418 includes a computer usable or readable storage device having stored thereon computer software (control logic) and/or data. Removable storage unit 418 may be a floppy disk, magnetic tape, compact disk, DVD, optical storage disk, or any other computer data storage device. Removable storage drive 414 reads from and/or writes to removable storage unit 418 in a well-known manner.

According to an exemplary embodiment, secondary memory 410 may include other means, instrumentalities or approaches for allowing computer programs and/or other instructions and/or data to be accessed by computer system 400. Such means, instrumentalities or approaches may include, for example, a removable storage unit 422 and an interface 420. Examples of the removable storage unit 422 and the interface 420 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 400 may further include a communication or network interface 424. Communication interface 424 enables computer system 400 to communicate and interact with any combination of remote devices, remote networks, remote entities, etc. (individually and collectively referenced by reference number 428). For example, communication interface 424 may allow computer system 400 to communicate with remote devices 428 over communications path 426, which may be wired and/or wireless, and which may include any combination of LANs, WANs, the Internet, etc. Control logic and/or data may be transmitted to and from computer system 400 via communication path 426.

In an embodiment, a tangible apparatus or article of manufacture comprising a tangible computer useable or readable medium having control logic (software) stored thereon is also referred to herein as a computer program product or program storage device. This includes, but is not limited to, computer system 400, main memory 408, secondary memory 410, and removable storage units 418 and 422, as well as tangible articles of manufacture embodying any combination of the foregoing. Such control logic, when executed by one or more data processing devices (such as computer system 400), causes such data processing devices to operate as described herein.

Based on the teachings contained in this disclosure, it will be apparent to persons skilled in the relevant art(s) how to make and use the embodiments using data processing devices, computer systems and/or computer architectures other than that shown in FIG. 4. In particular, embodiments may operate with software, hardware, and/or operating system implementations other than those described herein.

CONCLUSION

It is to be appreciated that the Detailed Description section, and not the Summary and Abstract sections (if any), is intended to be used to interpret the claims. The Summary and Abstract sections (if any) may set forth one or more but not all exemplary embodiments as contemplated by the inventor(s), and thus, are not intended to limit the embodiments or the appended claims in any way.

While the embodiments have been described herein with reference to exemplary embodiments for exemplary fields and applications, it should be understood that the subject matter is not limited thereto. Other embodiments and modifications thereto are possible, and are within the scope and spirit of the subject matter. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the embodiments should not be limited by any of the above-described exemplary embodiments, but should be defined only in accordance with the following claims and their equivalents.

What is claimed is:

1. A calibration unit comprising:
   a test head configured to rotate about a rotation axis between a first stationary angular position and a second stationary angular position, the rotation axis extending at an angle relative to a known axis, the test head having a first position configured to receive a first device under test (DUT) comprising a first application specific integrated circuit (ASIC) and a second position configured to receive a second DUT comprising a second ASIC; and
   a measurement unit electrically coupled to the first position and the second position, configured to measure a first output of the first DUT as the test head rotates between the first stationary angular position and the second stationary angular position, and configured to measure a second output of the first DUT at the second stationary angular position while the second DUT is loaded or unloaded onto the second position of the test head,
   wherein rotation of the test head about the rotation axis allows for excitation of at least three degrees of freedom of the first DUT, and
   wherein the measurement unit is configured to calibrate the first DUT by programming a calibration coefficient into the first ASIC.

2. The calibration unit of claim 1, wherein the first DUT and the second DUT are each a triaxis MEMS sensor.

3. The calibration unit of claim 2, wherein the triaxis MEMS sensor includes a magnetometer, gyroscope, accelerometer, pressure sensor, angular accelerometer or a combination thereof.

4. The calibration unit of claim 1, wherein the rotation of the test head about the rotation axis allows for excitation of at least six degrees of freedom of the first DUT.

5. The calibration unit of claim 4, wherein the rotation of the test head about the rotation axis allows for excitation of nine degrees of freedom of the first DUT.

6. The calibration unit of claim 1, further comprising electrical slip rings to electrically couple the measurement unit to the first position and the second position.

7. The calibration unit of claim 1, wherein the known axis is earth's gravitational field.

8. The calibration unit of claim 1, wherein the rotation of the test head about the rotation axis allows for gravitational excitation, Helmholtz coil excitation, or rotational-rate excitation of the at least three degrees of freedom of the first DUT.

9. The calibration unit of claim 1, wherein the rotation of the test head about the rotation axis allows for a combination of gravitational excitation, Helmholtz coil excitation, and rotational-rate excitation of at least six degrees of freedom of the first DUT.

10. The calibration unit of claim 1, further comprising a computer controlled remote servo motor coupled to the test head and configured to adjust an angular position, velocity, or acceleration of the test head.

11. The calibration unit of claim 10, wherein the computer controlled remote servo motor is further configured to rotate the test head from a distance such that an electromagnetic field of the motor does not affect the first DUT and the second DUT.

12. The calibration unit of claim 1, wherein the measurement unit electrically is further configured to measure a first output of the second DUT as the test head rotates between the first stationary angular position and the second stationary angular position, and further configured to measure a second output of the second DUT at the second stationary angular position;
    wherein the rotation of the test head about the rotation axis allows for excitation of at least three degrees of freedom of the second DUT substantially concurrently with the excitation of the at least three degrees of freedom of the first DUT.

13. A method for configuring devices under test (DUTS), comprising:
    loading a first device under test (DUT) comprising a first application specific integrated circuit (ASIC) onto a test head at a loading position;
    rotating the test head around a single rotation axis to a first fixed position, wherein the single rotation axis is at an angle relative to a known axis;
    exciting the first DUT at the first fixed position;
    measuring a first output of the first DUT at the first fixed position;
    rotating the test head around the single rotation axis to a second fixed position;
    exciting the first DUT at the second fixed position;
    measuring a second output of the first DUT at the second fixed position;
    programming a calibration coefficient into the first ASIC while the first DUT is loaded on the test head;
    loading, substantially concurrently with measuring the second output of the first DUT at the second fixed position, a second DUT comprising a second ASIC onto the test head; and
    unloading the first DUT at an unloading position,
    wherein the exciting the first DUT at the first and second positions allows for excitation of at least three degrees of freedom of the first DUT.

14. The method of claim 13, wherein the first DUT and the second DUT are each a triaxis MEMS magnetometer, gyroscope, accelerometer, or a combination thereof.

15. The method of claim 13, further comprising exciting the first DUT as the test head rotates, and measuring a third output of the first DUT as the test head rotates.

16. The method of claim 13, further comprising:
    exciting the second DUT at the second fixed position; and
    measuring an output of the second DUT at the second fixed position, wherein the exciting the first DUT at the first fixed position happens substantially concurrently with the exciting the second DUT at the second fixed position.

17. The method of claim 13, wherein the known axis is the earth's gravitational field.

18. The method of claim 13, further comprising performing gyroscopic or magnetic sensor testing.

19. The method of claim 13, wherein the exciting the first DUT at the first and second fixed positions comprises gravitational excitation, Helmholtz coil excitation, rotational rate excitation, or a combination thereof.

20. A triaxis MEMS calibration system comprising:
    a calibration unit comprising:
        a test head configured to rotate about a rotation axis between a first stationary angular position and a second stationary angular position, the rotation axis extending at an angle relative to a known axis, the test head having a first position configured to receive a first device under test (DUT) comprising a first application specific integrated circuit (ASIC) and a second position configured to receive a second DUT comprising a second ASIC; and a measurement unit electrically coupled to the first position and a second position, configured to receive the first DUT, configured to measure a first output of the first DUT as the test head rotates between the first stationary angular position and the second stationary angular position, and configured to measure a second output of the first DUT at the second stationary angular position, wherein rotation of the test head about the rotation axis allows for excitation of at least three degrees of freedom of the first DUT, and wherein the measurement unit is configured to calibrate the first DUT by programming a calibration coefficient into the first ASIC; and a turret handler configured to
  place the first DUT onto the test head and in the first position prior to rotation of the test head,
  remove the first DUT from the test head and the first position after rotation, and
  place the second DUT onto the second position of the test head while the measurement unit measures the second output of the first DUT at the second stationary angular position.

21. The triaxis MEMS calibration system of claim 20, further comprising a computer controlled remote servo motor coupled to the test head and configured to adjust an angular position, velocity, or acceleration of the test head.

22. The triaxis MEMS calibration system of claim 20, wherein the test head further comprises a third position configured to hold a third DUT; and wherein the turret handler is further configured to place the third DUT onto the test head and to remove the third DUT from the test head.

23. The triaxis MEMS calibration system of claim 20, wherein the calibration coefficient is based on a measured first output of the first DUT as the test head rotates between the first stationary angular position and the second stationary angular position, and on a measured second output of the first DUT at the second stationary angular position.

24. The method of claim 15, wherein the calibration coefficient is based on the measured third output of the first DUT as the test head rotates, the measured first output of the first DUT at the first fixed position, and the measured second output of the first DUT at the second fixed position.

25. The method of claim 24, wherein the loading position and the unloading position are the same position.

* * * * *